US010134840B2

(12) United States Patent
Yeh et al.

(10) Patent No.: US 10,134,840 B2
(45) Date of Patent: Nov. 20, 2018

(54) SERIES RESISTANCE REDUCTION IN VERTICALLY STACKED SILICON NANOWIRE TRANSISTORS

(71) Applicants: International Business Machines Corporation, Armonk, NY (US); Globalfoundries, Inc., Grand Cayman (KY); STMicroelectronics, Inc., Coppell, TX (US)

(72) Inventors: Chun-Chen Yeh, Clifton Park, NY (US); Xiuyu Cai, Niskayuna, NY (US); Qing Liu, Watervliet, NY (US); Ruilong Xie, Niskayuna, NY (US)

(73) Assignees: INTERNATIONAL BUSINESS MACHINES CORPORATION, Armonk, NY (US); GLOBALFOUNDRIES INC., Grand Cayman (KY); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/739,543

(22) Filed: Jun. 15, 2015

(65) Prior Publication Data
US 2016/0365411 A1    Dec. 15, 2016

(51) Int. Cl.
H01L 29/78     (2006.01)
H01L 21/265    (2006.01)
H01L 21/3065   (2006.01)
H01L 29/06     (2006.01)
H01L 29/66     (2006.01)
H01L 21/02     (2006.01)
H01L 21/306    (2006.01)
(Continued)

(52) U.S. Cl.
CPC .... *H01L 29/0673* (2013.01); *H01L 21/02381* (2013.01); *H01L 21/02532* (2013.01); (Continued)

(58) Field of Classification Search
CPC ....... H01L 2029/7858; H01L 21/26513; H01L 21/3065; H01L 29/0673; H01L 29/66795; (Continued)

(56) References Cited

U.S. PATENT DOCUMENTS 7,700,419 B2    4/2010   Anwar et al.
8,080,456 B2    12/2011  Barwicz et al.
(Continued)

OTHER PUBLICATIONS

Cai et al., "Series Resistance Reduction in Vertically Stacked Silicon Nanowire Transistors," U.S. Appl. No. 15/340,491, filed Nov. 1, 2016.
(Continued)

*Primary Examiner* — Mark Tornow
*Assistant Examiner* — Priya Rampersaud
(74) *Attorney, Agent, or Firm* — Cantor Colburn LLP; Vazken Alexanian

(57) ABSTRACT

Embodiments are directed to a method of fabricating a portion of a nanowire field effect transistor (FET). The method includes forming a sacrificial layer and a nanowire layer, removing a sidewall portion of the sacrificial layer and forming a diffusion block in a space that was occupied by the removed sidewall portion of the sacrificial layer. The method further includes forming a source region and a drain region such that the diffusion block is between the sacrificial layer and at least one of the source region and the drain region, and removing the sacrificial layer using a sacrificial layer removal process, wherein the diffusion block prevents the sacrificial layer removal process from also removing portions of at least one of the source region and the drain region.

9 Claims, 17 Drawing Sheets

(51) Int. Cl.
  *H01L 29/08* (2006.01)
  *H01L 29/423* (2006.01)
  *H01L 29/786* (2006.01)
  *H01L 29/10* (2006.01)

(52) U.S. Cl.
  CPC .... *H01L 21/3065* (2013.01); *H01L 21/30604* (2013.01); *H01L 29/0847* (2013.01); *H01L 29/42392* (2013.01); *H01L 29/6656* (2013.01); *H01L 29/66742* (2013.01); *H01L 29/66795* (2013.01); *H01L 29/785* (2013.01); *H01L 29/78696* (2013.01); *H01L 29/1033* (2013.01); *H01L 2029/7858* (2013.01)

(58) Field of Classification Search
  CPC ............ H01L 29/785; H01L 21/02529; H01L 21/02532; H01L 21/02543; H01L 21/02546; H01L 21/0259; H01L 21/283; H01L 21/7682; H01L 21/76897; H01L 29/0665; H01L 29/16; H01L 29/66522; H01L 29/6653; H01L 29/778
  See application file for complete search history.

(56) References Cited

U.S. PATENT DOCUMENTS

| | | | |
|---|---|---|---|
| 8,389,416 B2 | 3/2013 | Luong | |
| 8,472,239 B2 | 6/2013 | Chang et al. | |
| 8,809,131 B2 | 8/2014 | Bangsaruntip et al. | |
| 9,276,064 B1* | 3/2016 | Zang | H01L 29/0673 |
| 9,362,355 B1* | 6/2016 | Cheng | H01L 29/66742 |
| 9,620,590 B1* | 4/2017 | Bergendahl | H01L 29/0673 |
| 2005/0266645 A1* | 12/2005 | Park | H01L 29/1033 438/282 |
| 2008/0135949 A1 | 6/2008 | Lo et al. | |
| 2010/0207208 A1* | 8/2010 | Bedell | B82Y 10/00 257/346 |
| 2012/0007051 A1 | 1/2012 | Bangsaruntip et al. | |
| 2012/0138886 A1 | 6/2012 | Kuhn et al. | |
| 2016/0020305 A1* | 1/2016 | Obradovic | H01L 29/7391 257/39 |
| 2017/0069481 A1* | 3/2017 | Doris | H01L 21/0228 |

OTHER PUBLICATIONS

Cheng et al., "Inner Spacer for Nanosheet Transistors," U.S. Appl. No. 15/339,283, filed Oct. 31, 2016.
List of IBM Patents or Patent Applications Treated As Related; Date Filed: Jun. 15, 2015, pp. 1-2.
Cheng et al., "Method and structure for forming stacked nanosheet with improvement isolation," U.S. Appl. No. 15/422,572, filed Feb. 2, 2017.
List of IBM Patents or Patent Applications Treated As Related; Date Filed: Jun. 15, 2015, 2 pages.
Cheng et al., "Inner Spacer for Nanosheet Transistors," U.S. Appl. No. 15/826,841, filed Nov. 30, 2017.

* cited by examiner

SERIES RESISTANCE REDUCTION IN VERTICALLY STACKED SILICON NANOWIRE TRANSISTORS

BACKGROUND

The present disclosure relates in general to semiconductor devices and their manufacture. More specifically, the present disclosure relates to the fabrication of vertically stacked nanowire transistors having improved source to drain sheet resistance.

Transistors are semiconductor devices commonly found in a wide variety of integrated circuits. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions.

Gate-all-around (GAA) nanowire channel field-effect transistors (FETs) enable feature scaling beyond current planar CMOS technology. In its basic form, a nanowire-based FET includes a source region, a drain region and stacked nanowire channels between the source and drain regions. A gate which surrounds the stacked nanowire channels regulates electron flow through the nanowire channels between the source and drain regions. Forming GAA nanowires from alternating epitaxial layers of nanowire silicon (Si) and sacrificial silicon germanium (SiGe) provides superior channel electrostatics control, which is necessary for continuously scaling gate lengths down to seven (7) nanometer technology and below. However, the inclusion of stacked, strained Si/SiGe nanowire/sacrificial layers in the channel region of a GAA nanowire FET structure makes junction design and extension series resistance ($R_{ext}$) reduction difficult. A reduction in $R_{ext}$ would lead to enhanced driver current performance.

SUMMARY

Embodiments are directed to a method of fabricating a portion of a nanowire FET. The method includes forming a sacrificial layer and a nanowire layer, removing a sidewall portion of the sacrificial layer and forming a diffusion block in a space that was occupied by the removed sidewall portion of the sacrificial layer. The method further includes forming a source region and a drain region such that the diffusion block is between the sacrificial layer and at least one of the source region and the drain region, and removing the sacrificial layer using a sacrificial layer removal process, wherein the diffusion block prevents the sacrificial layer removal process from also removing portions of at least one of the source region and the drain region.

Embodiments are further directed to a nanowire FET including a sacrificial layer, a nanowire layer and a diffusion block formed adjacent to the sacrificial layer. The nanowire FET further includes a source region and a drain region positioned such that the diffusion block is between the sacrificial layer and at least one of the source region and the drain region, wherein the diffusion block prevents a sacrificial layer removal process performed during fabrication of the nanowire FET from also removing portions of at least one of the source region and the drain region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Figure 1A:
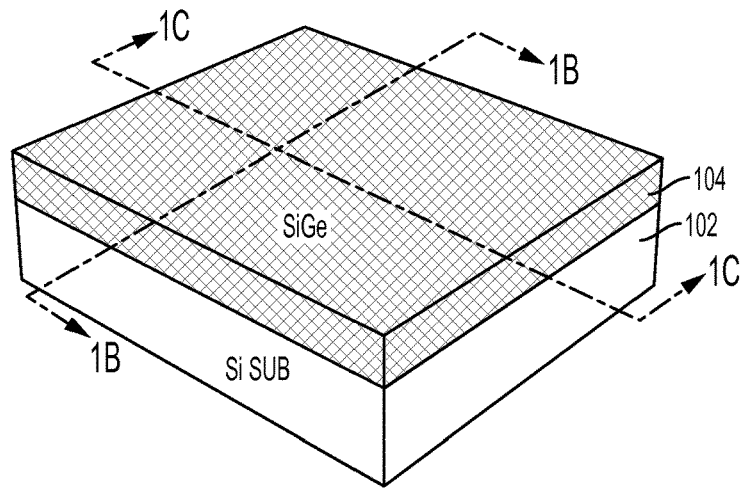
FIG. 1A depicts a perspective view of a semiconductor device after a fabrication stage according to one or more embodiments.

It is understood in advance that although this disclosure includes a detailed description of an exemplary GAA nanowire FET configuration, implementation of the teachings recited herein are not limited to a particular FET structure disclosed herein. Rather, embodiments of the present disclosure are capable of being implemented in conjunction with any other type of FET device now known or later developed.

A semiconductor structure may comprise a number of FETs, with each FET including a source, a drain, a channel and a gate. The channel connects the source and the drain, and electrical current flows through the channel from the source to the drain. The electrical current flow is induced in the channel by a voltage applied at the gate. The size of an FET is related to the electrical conductivity of the channel material. If the channel material has a relatively high conductivity, the FET may be made correspondingly smaller. In a relatively small FET, a channel may comprise a nanostructure, also referred to as a nanowire.

As previously noted herein, GAA nanowire channel FETs enable feature scaling beyond current planar CMOS technology. In its basic form, a nanowire-based FET includes a source region, a drain region and stacked nanowire channels between the source and drain regions. A gate which surrounds the stacked nanowire channels regulates electron flow through the nanowire channels between the source and drain regions. Forming GAA nanowires from alternating epitaxial layers of nanowire silicon (Si) and sacrificial silicon germanium (SiGe) provides superior channel electrostatics control, which is necessary for continuously scaling gate lengths down to seven (7) nanometer technology and below. The use of SiGe/Si sacrificial/nanowire layers to form the channel regions in semiconductor devices provides desirable device characteristics, including the introduction of strain at the interface between SiGe and Si. However, the inclusion of stacked, strained Si/SiGe nanowire/sacrificial layers in the channel region of a GAA nanowire FET structure makes junction design and $R_{ext}$ reduction difficult. A reduction in $R_{ext}$ would lead to enhanced driver current performance.

Accordingly, the present disclosure provides fabrication methodologies and resulting devices for stacked nanowire transistors having improved source to drain sheet resistance. In one or more embodiments, the semiconductor device fabrication methodology includes processes to remove and release sacrificial layers from nanowire layers that will form the channel region of the device. A diffusion block is locally formed between the sacrificial layers and the source and drain regions of the device. The diffusion block is positioned such that processes that remove the sacrificial layers of the channel region during device fabrication do not also attack the source and drain regions of the device. As described in greater detail herein below, the diffusion block may be formed from nitride, which prevents excess gauging during certain reactive ion etch (RIE) processes that may be applied during the sacrificial layer removal process of the overall device fabrication process. Although the diffusion block in the disclosed embodiments is formed from nitride, it may be formed from any material for which subsequent device fabrication operations are not very selective. Selectivity, as used in the present disclosure, refers to the tendency of a process operation to impact a particular material. One example of low selectivity is a relatively slow etch rate. One example of a higher or greater selectivity is a relatively faster etch rate. For the disclosed embodiments, a material for the diffusion block is selected based on a selectivity of subsequent device fabrication operations for the selected material being below a predetermined threshold.

FIGS. 1-12 are diagrams illustrating a GAA nanowire FET device at various stages of a fin-first, wire-last replacement gate fabrication methodology according to one or more embodiments of the present disclosure. As described in greater detail herein below, in accordance with one or more embodiments of the present disclosure, a diffusion block section is formed locally and positioned between a sacrificial layer of the nanowire FET device and the source and drain regions of the nanowire FET device. The diffusion block is positioned such that a process that removes the sacrificial layer during device fabrication does not also attack the source and drain regions of the nanowire FET device.

Figure 1B:
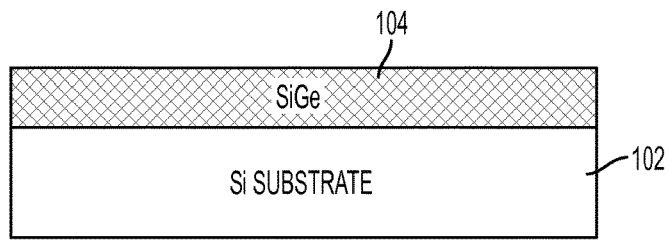
FIG. 1B depicts a cross-sectional view of the semiconductor device shown in FIG. 1A, taken along line 1B-1B.
Figure 1C:
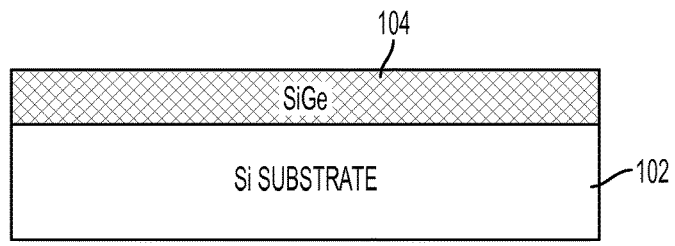
FIG. 1C depicts a cross-sectional view of the semiconductor device shown in FIG. 1A, taken along line 1C-1C.
Figure 2A:
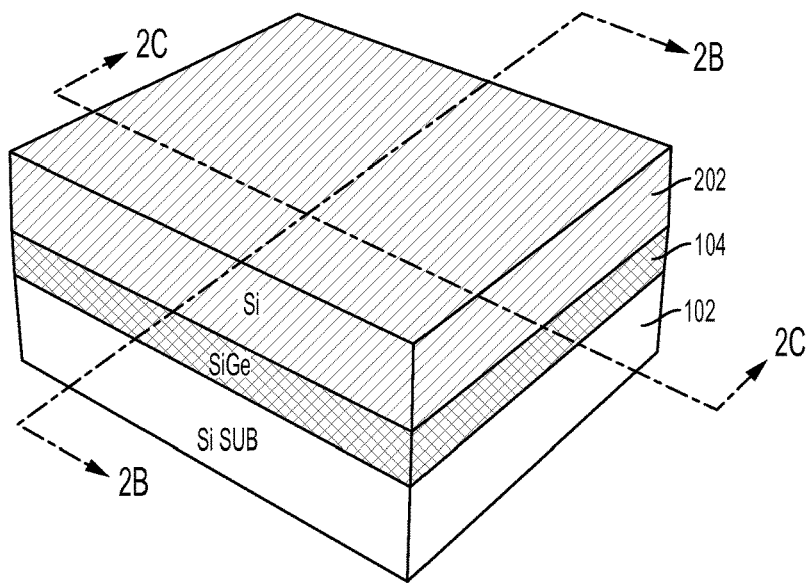
FIG. 2A depicts a perspective view of a semiconductor device after a fabrication stage according to one or more embodiments.
Figure 2B:
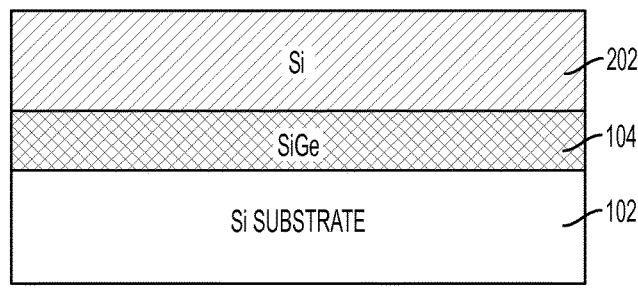
FIG. 2B depicts a cross-sectional view of the semiconductor device shown in FIG. 2A, taken along line 2B-2B.
Figure 2C:
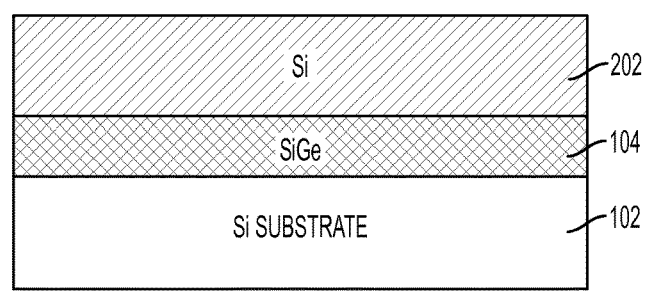
FIG. 2C depicts a cross-sectional view of the semiconductor device shown in FIG. 2A, taken along line 2C-2C.
Figure 3A:
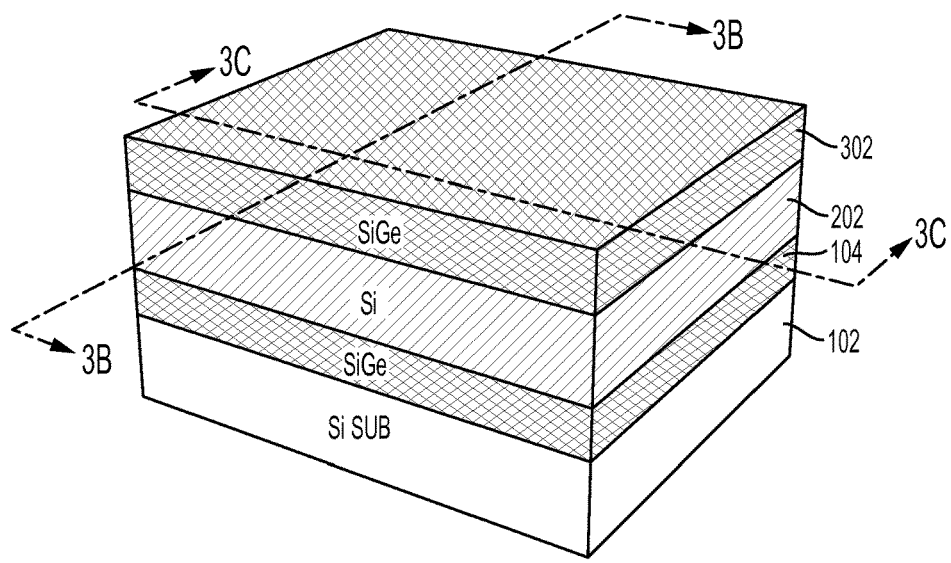
FIG. 3A depicts a perspective view of a semiconductor device after a fabrication stage according to one or more embodiments.
Figure 3B:
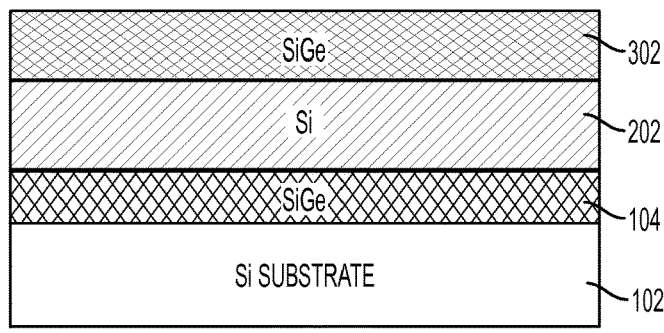
FIG. 3B depicts a cross-sectional view of the semiconductor device shown in FIG. 3A, taken along line 3B-3B.
Figure 3C:
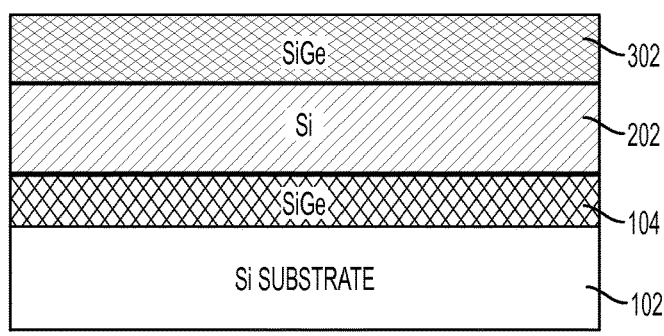
FIG. 3C depicts a cross-sectional view of the semiconductor device shown in FIG. 3A, taken along line 3C-3C.
Figure 4A:
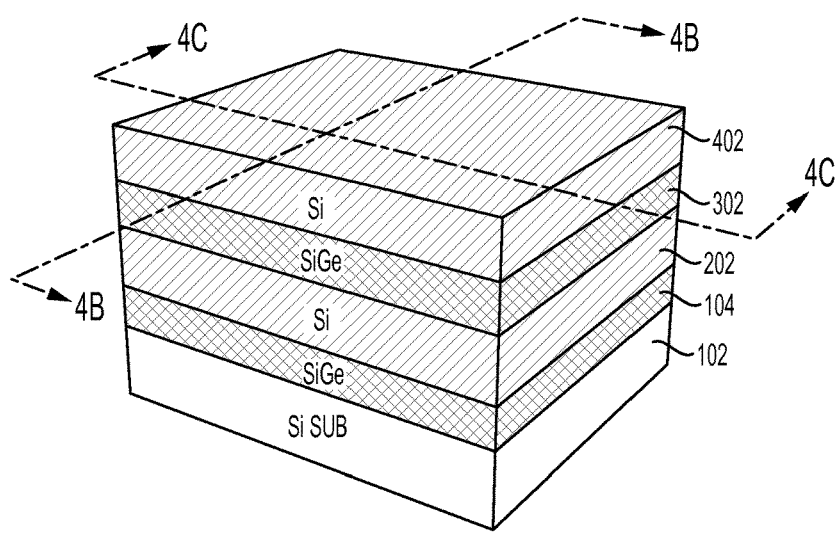
FIG. 4A depicts a perspective view of a semiconductor device after a fabrication stage according to one or more embodiments.
Figure 4B:
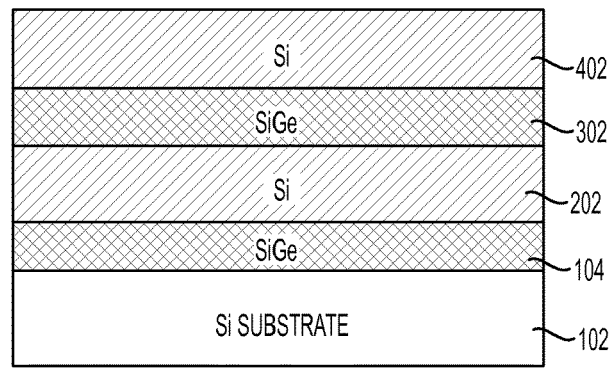
FIG. 4B depicts a cross-sectional view of the semiconductor device shown in FIG. 4A, taken along line 4B-4B.
Figure 4C:
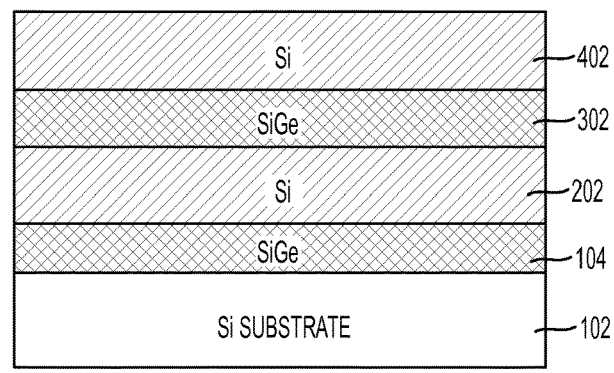
FIG. 4C depicts a cross-sectional view of the semiconductor device shown in FIG. 4A, taken along line 4C-4C.

As shown in FIGS. 1A to 1C, an alternating series of nanowire Si layers and sacrificial SiGe layers are formed in a stack on a bulk Si substrate 102. Specifically, FIG. 1A depicts a three dimensional (perspective) illustration of a SiGe sacrificial layer 104 epitaxially grown on bulk Si substrate 102. FIG. 1B depicts a cross sectional view of the semiconductor device shown in FIG. 1A taken along line 1B-1B, and FIG. 1C depicts a cross sectional view of the semiconductor device shown in FIG. 1A taken along line 1C-1C. FIG. 2A depicts a three dimensional illustration of an undoped nanowire Si layer 202 epitaxially grown on sacrificial SiGe layer 104. FIG. 2B depicts a cross sectional view of the semiconductor device shown in FIG. 2A taken along line 1B-2B, and FIG. 2C depicts a cross sectional view of the semiconductor device shown in FIG. 2A taken along line 2C-2C. FIG. 3A depicts a three dimensional illustration of another sacrificial SiGe layer 302 epitaxially grown on nanowire Si layer 202. FIG. 3B depicts a cross sectional view of the semiconductor device shown in FIG. 3A taken along line 3B-3B, and FIG. 3C depicts a cross sectional view of the semiconductor device shown in FIG. 3A taken along line 3C-3C. FIG. 4A depicts a three dimensional illustration of an undoped nanowire Si layer 402 epitaxially grown on sacrificial SiGe layer 302. FIG. 4B depicts a cross sectional view of the semiconductor device shown in FIG. 4A taken along line 4B-4B, and FIG. 4C depicts a cross sectional view of the semiconductor device shown in FIG. 4A taken along line 4C-4C. For ease of illustration, four alternating layers 104, 202, 302, 402 are shown. However, one or more additional sacrificial layers and/or crystalline nanowire layers may optionally be epitaxially grown in an alternating fashion on top of substrate 102, wherein the properties of the additional sacrificial layer(s) are the same as sacrificial layers 104, 302, and the properties of the additional crystalline nanowire layer(s) are the same as nanowire Si layers 202, 402.

Figure 5A:
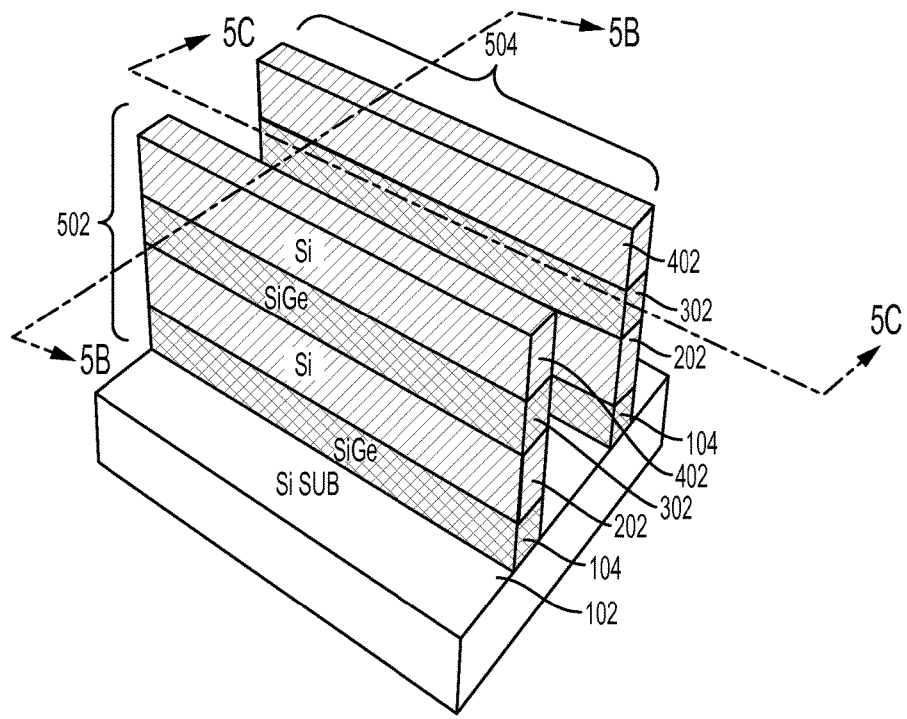
FIG. 5A depicts a perspective view of a semiconductor device after a fabrication stage according to one or more embodiments.
Figure 5B:
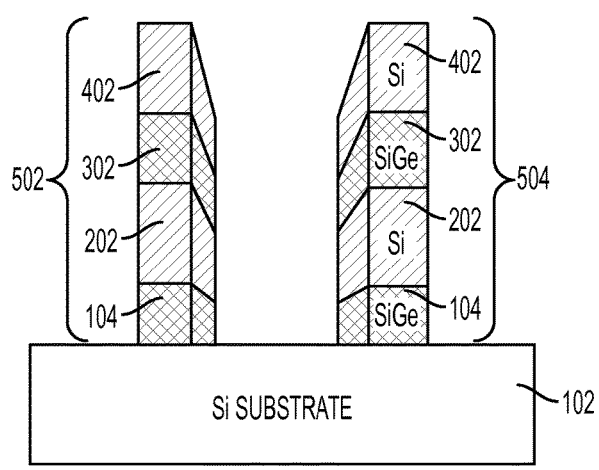
FIG. 5B depicts a cross-sectional view of the semiconductor device shown in FIG. 5A, taken along line 5B-5B.
Figure 5C:
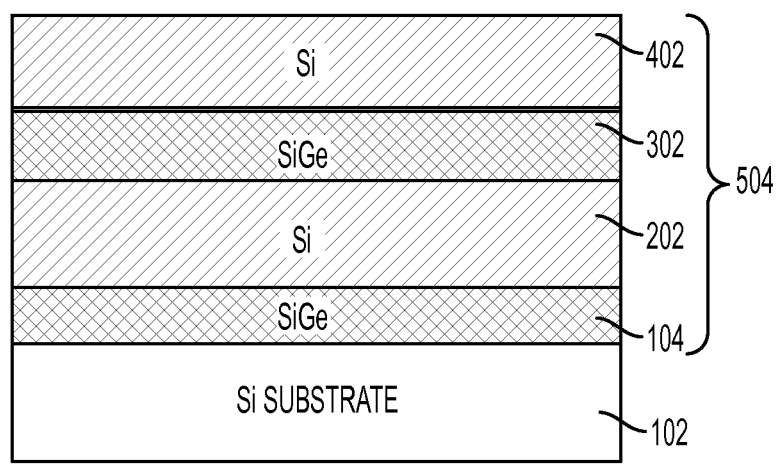
FIG. 5C depicts a cross-sectional view of the semiconductor device shown in FIG. 5A, taken along line 5C-5C.

Known processing techniques are applied to the semiconductor device structure shown in FIGS. 4A-4C to form a plurality of fin-shaped regions 502, 504 having alternating layers of sacrificial SiGe 104, 302 and nanowire Si 202, 402, which are shown as a three dimensional view in FIG. 5A and two dimensional views in FIGS. 5B and 5C. For example, the known processing techniques may include the formation of fin hard masks (not shown) over nanowire Si layer 402. The fin hard masks may be formed by first depositing the hard mask material (for example silicon nitride) onto nanowire Si layer 402 using, for example, chemical vapor deposition (CVD), plasma enhanced CVD (PECVD) or any suitable technique for dielectric deposition that does not induce a physical or chemical change to nanowire Si layer 402. According to an exemplary embodiment, the hard mask material is deposited onto nanowire Si layer 402. The deposited hard mask material is then patterned into a plurality of the individual fin hard masks. The patterning of the hard masks is commensurate with a desired footprint and location of fin-shaped regions 502, 504, which will be used to form the channel regions of the semiconductor device. According to an exemplary embodiment, a resist film (not shown) is deposited on the hard mask material and patterned with the footprint and location of each of fin-shaped region 502, 504. In one example, RIE is used to form the fin hard masks, and therefore the resist film comprises a resist material such as hydrogen silsesquioxane (HSQ) patterned using electron beam (e-beam) lithography and transferred to a carbon-based resist.

As described in greater detail herein below, portions of fin-shaped regions 502, 504 formed by nanowire Si layers 104, 302, once released from sacrificial SiGe layers 202, 402, will form nanowire channels of the semiconductor device. Because the fin etch is being performed before the dummy gate/replacement gate steps (described in greater detail later herein), the semiconductor device fabrication processes described herein may be referred to as a fin first process. Additionally, because the nanowire channels (e.g., portions of nanowire Si layers 202, 402) formed in fin-shaped regions 502, 504 will be released from the sacrificial layers 104, 302 after the dummy gate/replacement gate steps, the semiconductor device fabrication process described herein may also be referred to as a wire last process. Each sacrificial SiGe layer 104, 302, following the fin etch, is thinner than each nanowire Si layer 202, 402.

Additional details of suitable GAA nanowire FET structures fabricated according to replacement gate, fin-first, wire last fabrication techniques are disclosed in U.S. Pat. No. 8,809,313, which is assigned to the assigned of the present disclosure, and which is incorporated by reference herein in its entirety.

Figure 6A:
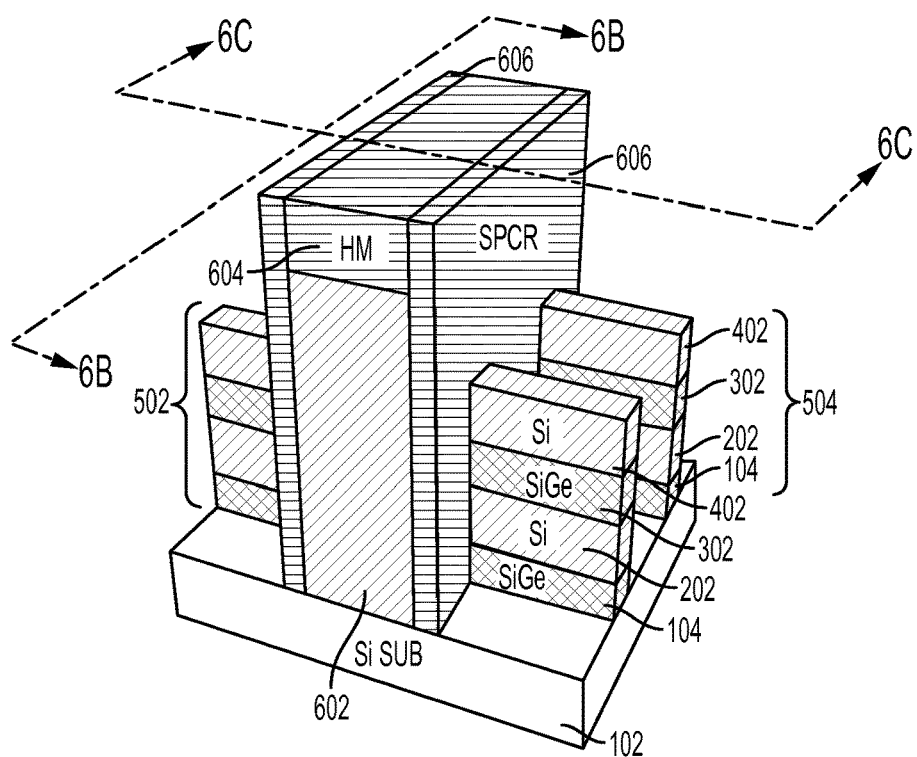
FIG. 6A depicts a perspective view of a semiconductor device after a fabrication stage according to one or more embodiments.
Figure 6B:
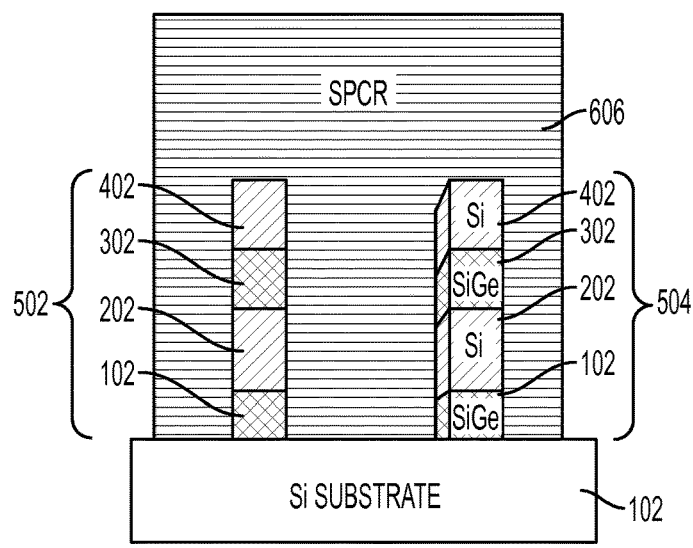
FIG. 6B depicts a cross-sectional view of the semiconductor device shown in FIG. 6A, taken along line 6B-6B.
Figure 6C:
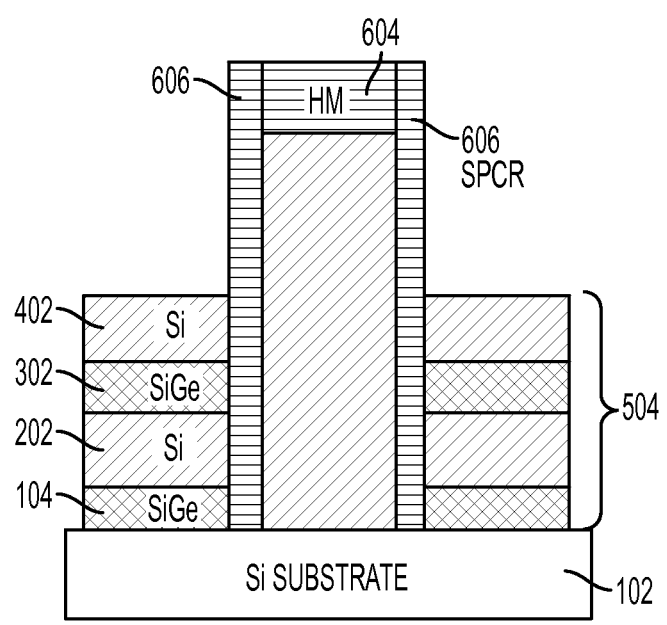
FIG. 6C depicts a cross-sectional view of the semiconductor device shown in FIG. 6A, taken along line 6C-6C.

FIG. 6A depicts a cross-sectional view of the semiconductor device after a next fabrication stage. FIG. 6B depicts a cross-sectional view of the semiconductor device shown in FIG. 6A, taken along line 6B-6B, and FIG. 6C depicts a cross-sectional view of the semiconductor device shown in FIG. 6A, taken along line 6C-6C. As shown in FIGS. 6A, 6B, and 6C, a dummy gate 602 is formed over fin-shaped regions 502, 504 using an HK deposition process. As also shown in FIGS. 6A, 6B and 6C, a hard mask (HM) 604 is deposited over dummy gate 602. As also shown in FIGS. 6A, 6B and 6C, offset spacers 606 are formed along the sidewalls of dummy gate 602, as shown. Offset spacers 606 may be formed using a spacer pull down formation process. Offset spacers 606 may also be formed using a sidewall image transfer (SIT) spacer formation process, which includes spacer material deposition followed by directional RIE of the deposited spacer material. The nanowire portions of fin-shaped regions 502, 504 that are surrounded by dummy gate 602 will form the nanowire channel regions of the semiconductor device.

Figure 7A:
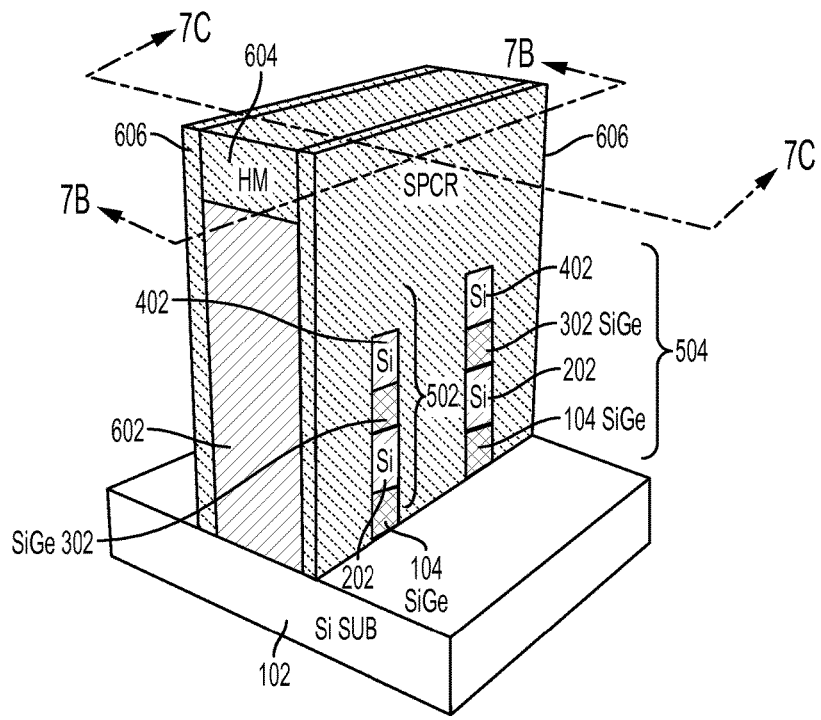
FIG. 7A depicts a perspective view of a semiconductor device after a fabrication stage according to one or more embodiments.
Figure 7B:
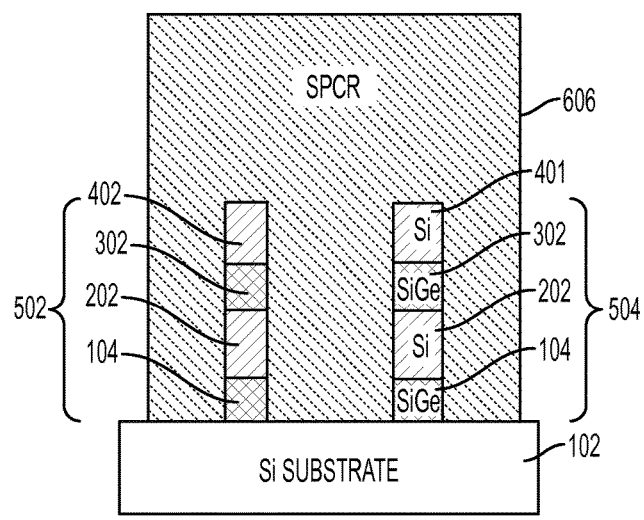
FIG. 7B depicts a cross-sectional view of the semiconductor device shown in FIG. 7A, taken along line 7B-7B.
Figure 7C:
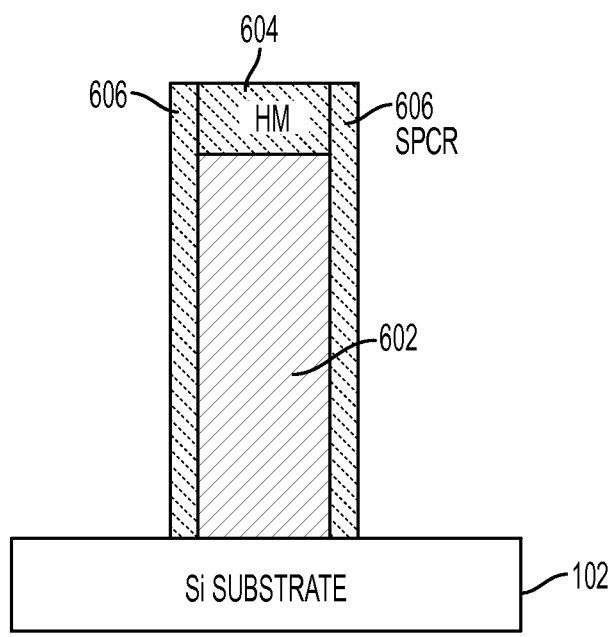
FIG. 7C depicts a cross-sectional view of the semiconductor device shown in FIG. 7A, taken along line 7C-7C.

FIG. 7A depicts a cross-sectional view of the semiconductor device after a next fabrication stage. FIG. 7B depicts a cross-sectional view of the semiconductor device shown in FIG. 7A, taken along line 7B-7B, and FIG. 7C depicts a cross-sectional view of the semiconductor device shown in FIG. 7A, taken along line 7C-7C. As shown in FIGS. 7A, 7B and 7C, the exposed portions of fin-shaped regions 502, 504 are recessed in the source drain region using a silicon RIE process. The recessed fin-shaped regions 502, 504 can be controlled such that the full channel width of each layer 104, 202, 302, 402 is exposed on a surface of offset spacers 606.

Figure 8A:
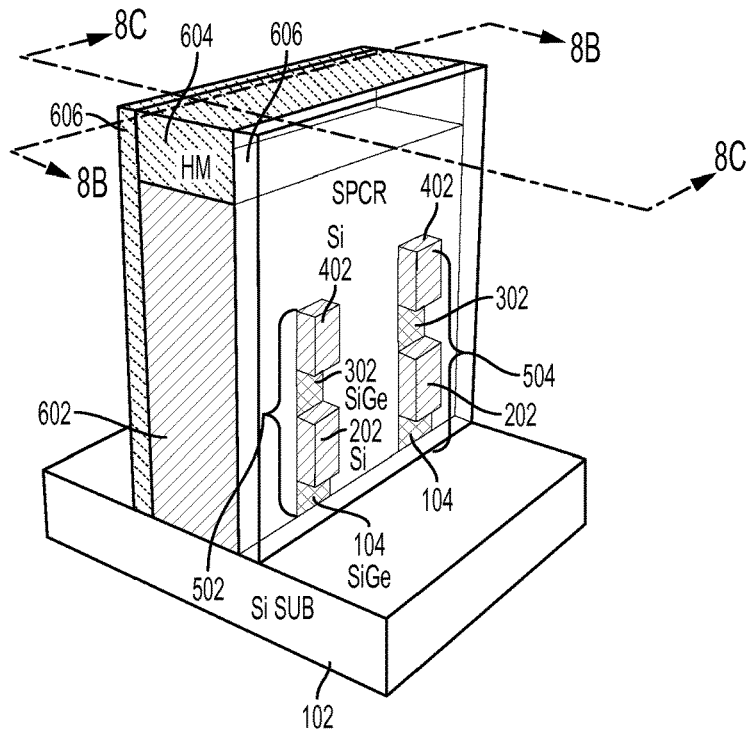
FIG. 8A depicts a perspective view of a semiconductor device after a fabrication stage according to one or more embodiments.
Figure 8B:
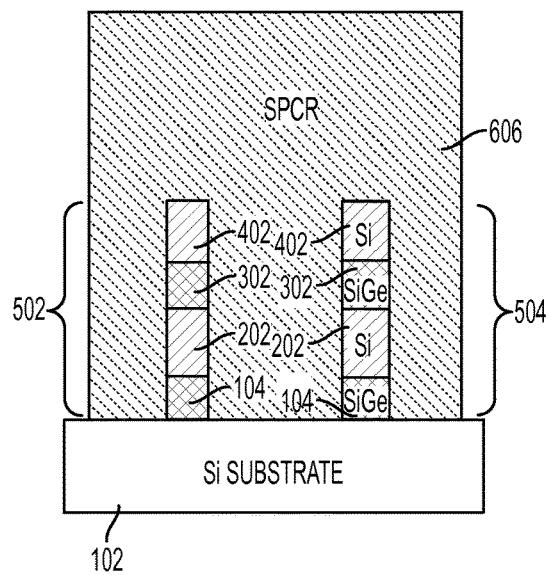
FIG. 8B depicts a cross-sectional view of the semiconductor device shown in FIG. 8A, taken along line 8B-8B.
Figure 8C:
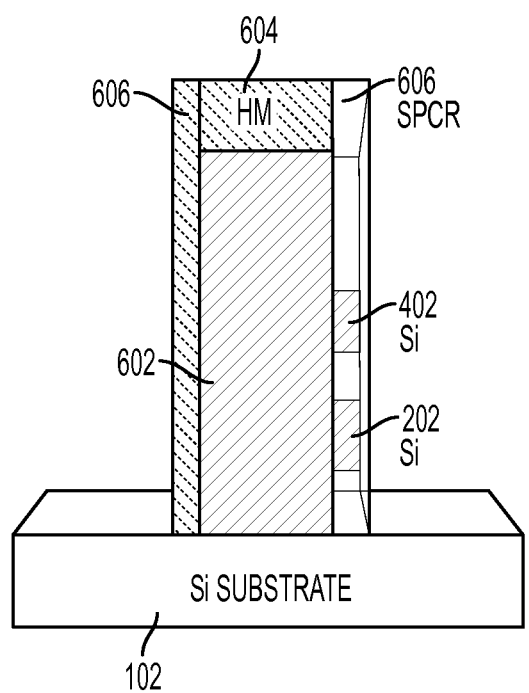
FIG. 8C depicts a cross-sectional view of the semiconductor device shown in FIG. 8A, taken along line 8C-8C.

FIG. 8A depicts a cross-sectional view of the semiconductor device after a next fabrication stage. FIG. 8B depicts a cross-sectional view of the semiconductor device shown in FIG. 8A, taken along line 8B-8B, and FIG. 8C depicts a cross-sectional view of the semiconductor device shown in FIG. 8A, taken along line 8C-8C. As shown in FIGS. 8A, 8B and 8C, sacrificial SiGe layers 104, 302 are pulled back from underneath offset spacer 606 using a hydrogen chloride (HCL) gas isotropic etch process.

Figure 9A:
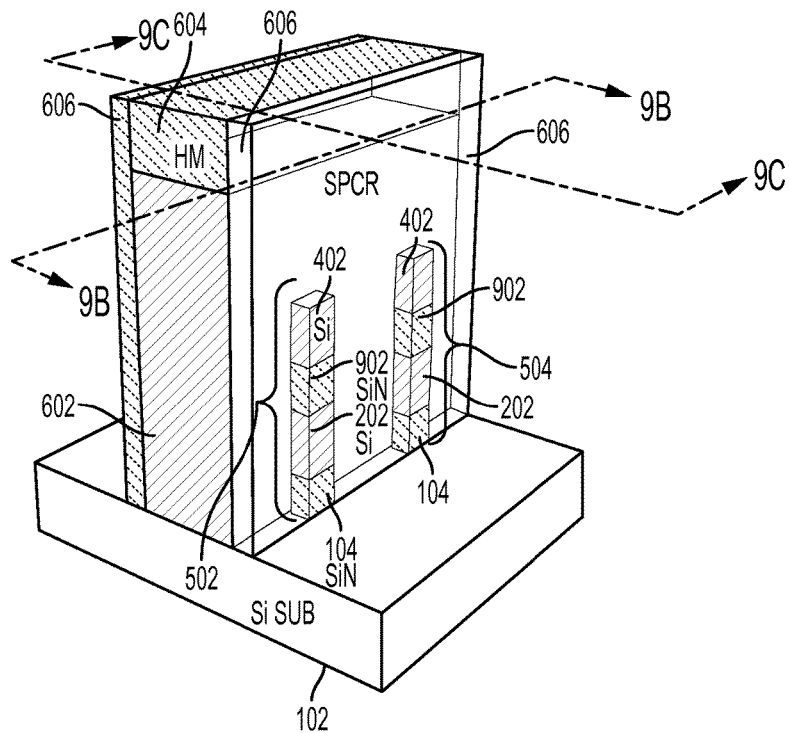
FIG. 9A depicts a perspective view of a semiconductor device after a fabrication stage according to one or more embodiments.
Figure 9B:
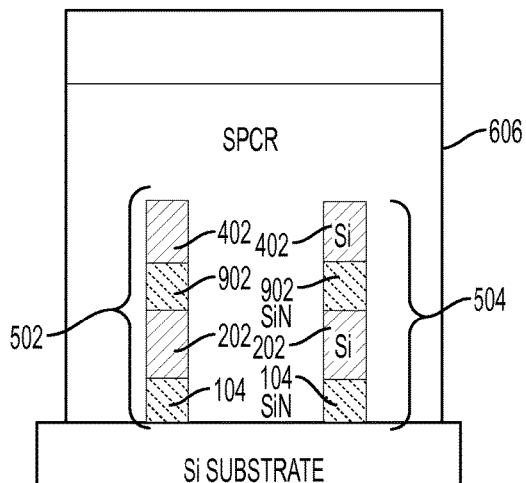
FIG. 9B depicts a cross-sectional view of the semiconductor device shown in FIG. 9A, taken along line 9B-9B.
Figure 9C:
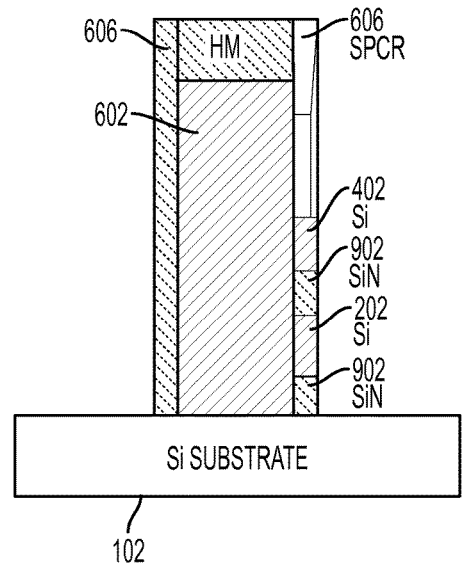
FIG. 9C depicts a cross-sectional view of the semiconductor device shown in FIG. 9A, taken along line 9C-9C.

FIG. 9A depicts a cross-sectional view of the semiconductor device after a next fabrication stage. FIG. 9B depicts a cross-sectional view of the semiconductor device shown in FIG. 9A, taken along line 9B-9B, and FIG. 9C depicts a cross-sectional view of the semiconductor device shown in FIG. 9A, taken along line 9C-9C. As shown in FIGS. 9A, 9B and 9C, in accordance with one or more embodiments of the present disclosure, diffusion blocks 902 are formed to fill the space formed in sacrificial SiGe layers 104, 302. Diffusion blocks 902 may be formed conformally by CVD, or by monolayer doping (MLD) of nitride followed by spacer RIE. Diffusion blocks 902 are positioned such that subsequent etching processes that remove sacrificial layers of the channel region during device fabrication do not also attack the source and drain regions 1002, 1004 (shown in FIGS. 10A, 10B and 10C) of the semiconductor device. Diffusion blocks 902 may be formed from a nitride containing material (e.g., silicon nitride (SiN)), which prevents excess gauging during subsequent RIE processes (e.g., sacrificial layer removal) that are applied during the semiconductor device fabrication process. Although diffusion blocks 902 shown in FIGS. 9A, 9B and 9C are formed from a nitride containing material, they may be formed from any material for which subsequent device fabrication operations are not very selective. Selectivity, as used in the present disclosure, refers to the tendency of a process operation to impact a particular material. One example of low selectivity is a relatively slow etch rate. One example of a higher or greater selectivity is a relatively faster etch rate. For the disclosed embodiments, a material for diffusion blocks 902 is selected based on a selectivity of subsequent device fabrication operations for the selected material being below a predetermined threshold.

Figure 10A:
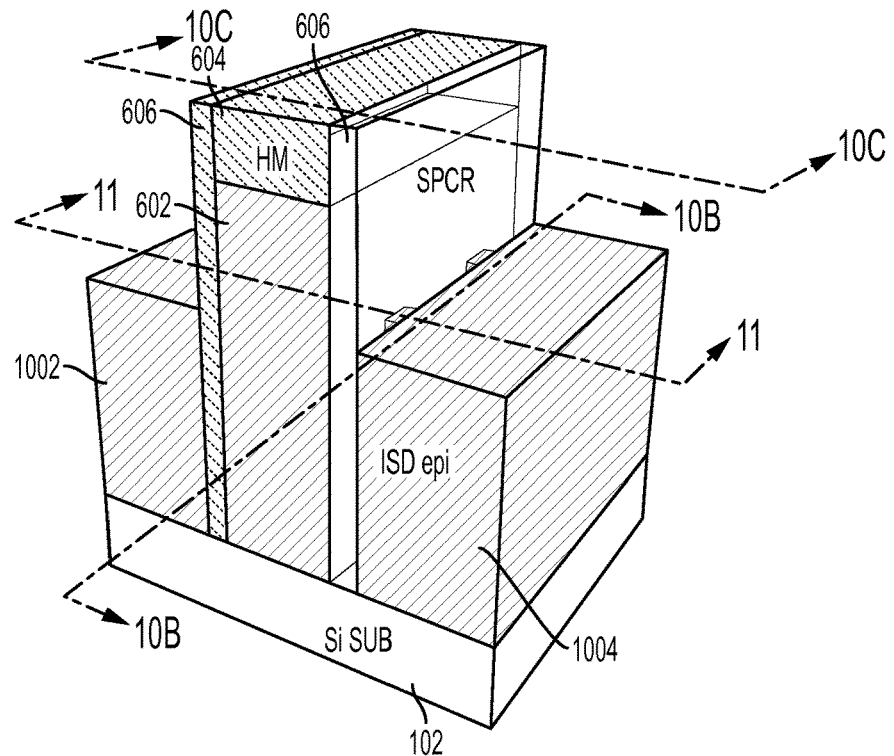
FIG. 10A depicts a perspective view of a semiconductor device after a fabrication stage according to one or more embodiments.
Figure 10B:
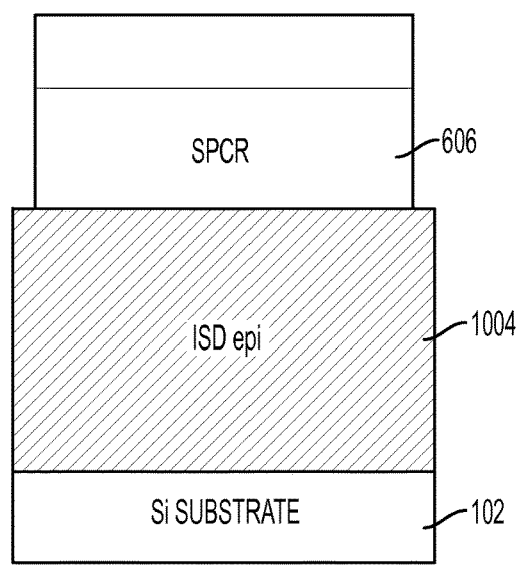
FIG. 10B depicts a cross-sectional view of the semiconductor device shown in FIG. 10A, taken along line 10B-10B.
Figure 10C:
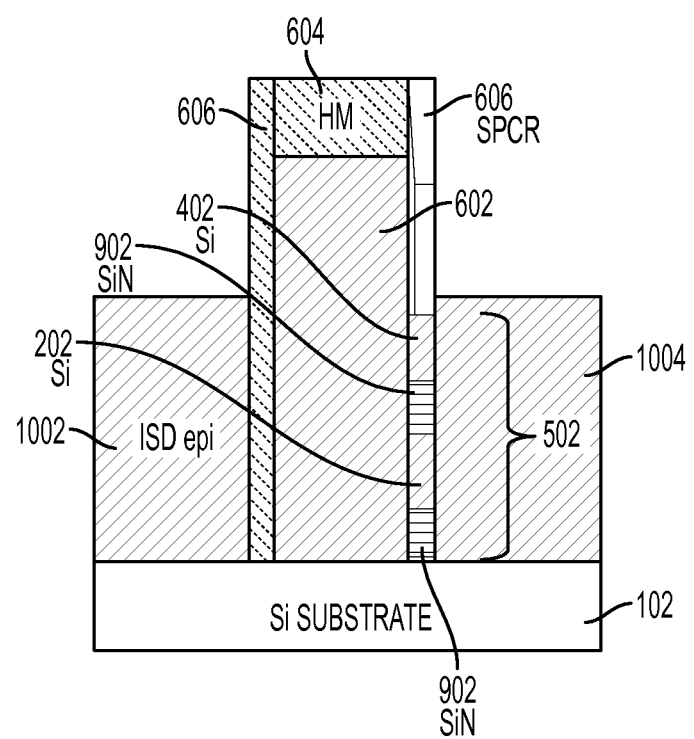
FIG. 10C depicts a cross-sectional view of the semiconductor device shown in FIG. 10A, taken along line 10C-10C.

FIG. 10A depicts a three-dimensional view of the semiconductor device after a next fabrication stage. FIG. 10B depicts a cross-sectional view of the semiconductor device shown in FIG. 10A, taken along line 10B-10B, and FIG. 10C depicts a cross-sectional view of the semiconductor device shown in FIG. 10A, taken along line 10C-10C. As shown in FIGS. 10A, 10B and 10C, raised source/drain (SD) regions 1002, 1004 are formed using an epitaxial layer growth process on the ends of exposed nanowire Si layers 202, 402. In-situ doping (ISD) is applied (e.g., by ion implantation) to form doped S/D regions 1002, 1004, thereby creating the necessary junctions of the semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices may be formed by implanting arsenic (As) or phosphorous (P), and p-type devices may be formed by implanting boron (B).

Figure 11:
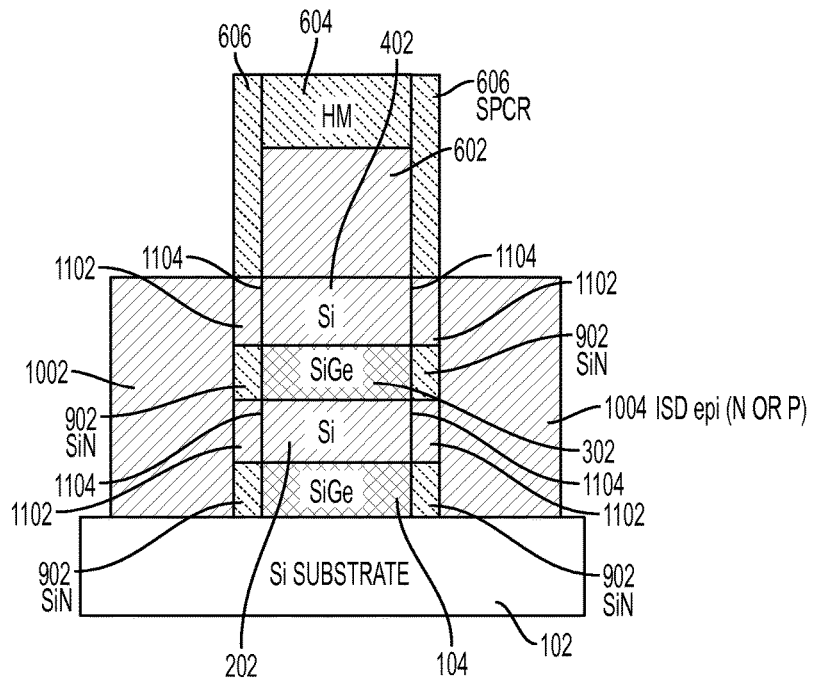
FIG. 11 depicts a cross-sectional view of the semiconductor device shown in FIG. 10A, taken along line 11-11.

FIG. 11 depicts a cross-sectional view of the semiconductor device shown in FIG. 10A, taken along line 11-11. As previously noted, S/D regions 1002, 1004 are in-situ doped (e.g., by ion implantation) to form extension regions 1102 having extension junctions 1104 within nanowire Si layers 202, 402. Extension regions 1102 and extension junctions 1104 extend under offset spacers 606, and the regions of nanowire Si layers 202, 402 under gate dummy gate 602 remains undoped. The doping of extension regions 1102 can be performed by implanting nanowire Si layers 202, 402 with ions. Extension junctions 1104 reduce the $R_{ext}$ of the nanowire FET device when turned on by a gate bias voltage, and also form a conducting path between S/D regions 1002, 1004 and channel regions formed by nanowire Si layers 202, 402.

Figure 12:
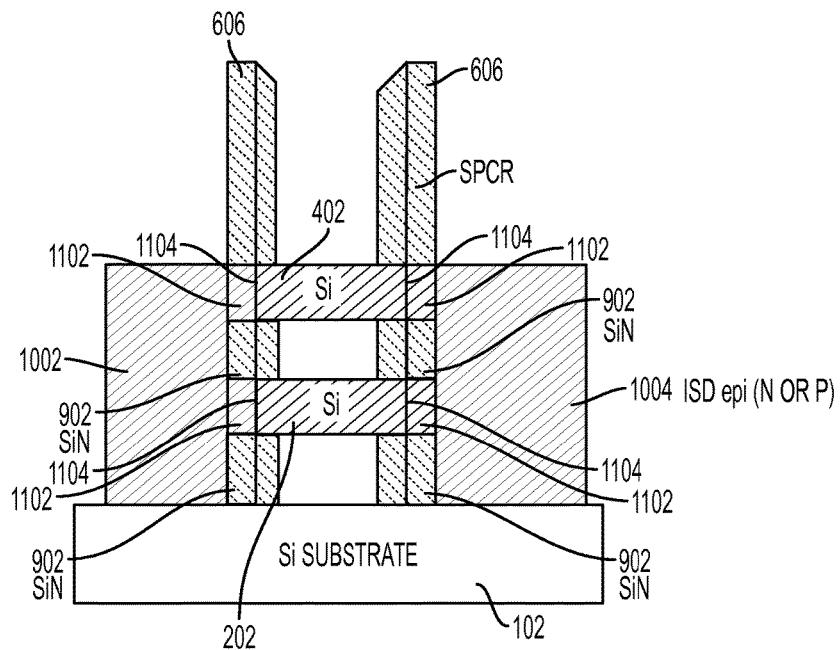
FIG. 12 depicts a cross-sectional view of the semiconductor device shown in FIG. 11 after a fabrication stage according to one or more embodiments.

FIG. 12 depicts the nanowire FET device shown in FIG. 11 after a near-final fabrication stage, wherein the dummy gate 602 and sacrificial SiGe layers 104, 302 have been removed by a known etching process, e.g., RIE or chemical oxide removal (COR). In a gate-late fabrication process, the removed dummy gate structure 602 (shown in FIGS. 6A to 11) is thereafter replaced with a metal gate (not shown) as known in the art. Dummy gate 602 can be removed by an etching process, e.g., RIE or COR, to form a trench. A dielectric material and one or more gate metals (not shown) can then be deposited within the trench. For example, an HK dielectric material, e.g., hafnium based material, can be deposited to form a gate dielectric. A metal liner, e.g., a work-function metal, and a gate metal can then be deposited on the dielectric material to complete the gate formation. In one or more embodiments, the metal liner can be, for example, TiN or TaN, and the gate metal can be aluminum or tungsten.

Figure 13:
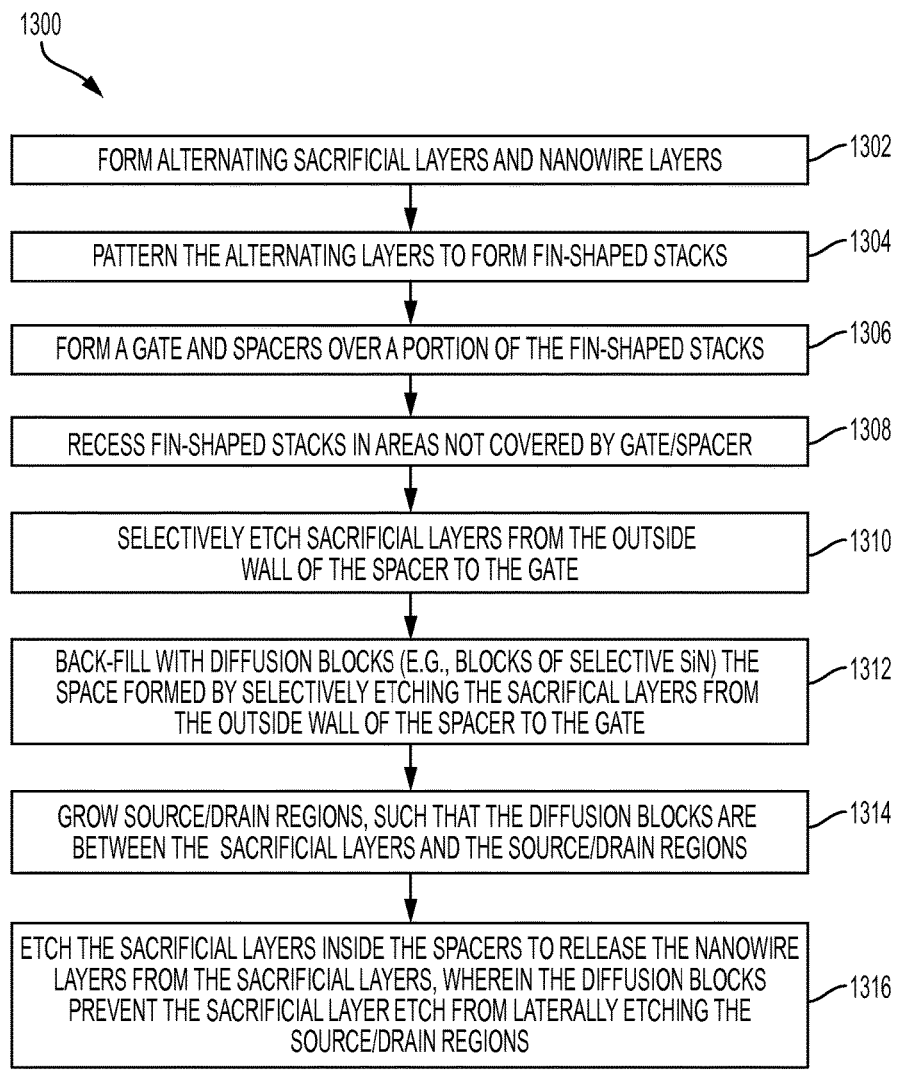
FIG. 13 is a flow diagram illustrating a methodology according to one or more embodiments.

FIG. 13 is a flow diagram illustrating a methodology 1300 according to one or more embodiments. At block 1302 alternating sacrificial layers and nanowire layers are formed. Block 1304 patterns the alternating sacrificial layers and nanowire layers to form fin-shaped stacks. Block 1306 forms a dummy gate and spacers over portions of the fin-shaped stacks. The portions of the nanowire layers underneath the gate will form the channel region of the nanowire FET device. Block 1308 recesses the fin-shaped stacks in areas not covered by the gate and the spacers. Block 1310 removes sidewall portions of the sacrificial layers by selectively etching the sacrificial layers from the outside wall of the spacer to the dummy gate. Block 1312 backfills the removed sidewall portions with diffusion blocks (e.g., blocks of selective SiN). Block 1314 grows source/drain regions such that the diffusion blocks are between the sacrificial layers and the source/drain regions. Growing the source/drain regions may include in-situ doping to form the necessary junctions for either n-type or p-type nanowire FET devices, including extension junctions in the nanowire layers at the interface between the nanowire layers and the source/drain regions. Block 1316 removes the sacrificial layers using a sacrificial layer removal process such as an etching process. The diffusion blocks prevent the sacrificial layer etching process from laterally etching the source/drain regions.

Thus, it can be seen from the forgoing detailed description and accompanying illustrations that embodiments of the present disclosure provide structures and methodologies for providing a nanowire FET device having improved junction design, reduced series resistance and improved source to drain sheet resistance. In one or more embodiments, the semiconductor device fabrication methodology includes processes to remove and release sacrificial layers from nanowire layers that will form the channel region of the device. A diffusion block is locally formed between the sacrificial layers and the source and drain regions of the device. The diffusion block is positioned such that processes that remove the sacrificial layers of the channel region during device fabrication do not also attack the source and drain regions of the device. The diffusion block may be formed from nitride, which prevents excess gauging during certain reactive ion etch (RIE) processes that may be applied during the sacrificial layer removal process of the overall device fabrication process. The diffusion block may be formed from any material for which subsequent device fabrication operations are not very selective. Selectivity, as used in the present disclosure, refers to the tendency of a process operation to impact a particular material. One example of low selectivity is a relatively slow etch rate. One example of a higher or greater selectivity is a relatively faster etch rate. For the disclosed embodiments, a material for the diffusion block is selected based on a selectivity of subsequent device fabrication operations for the selected material being below a predetermined threshold.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of fabricating a portion of a nanowire field effect transistor (FET), the method comprising:
   forming a sacrificial layer and a nanowire layer;
   forming a spacer around portions of the sacrificial layer and the channel nanowire layer;
   removing selected portions of the sacrificial layer and the nanowire layer that are not under the spacer such that a sidewall portion of the sacrificial layer and a sidewall portion of the nanowire layer are exposed;
   selectively removing a portion of the sidewall portion of the sacrificial layer;
   forming a diffusion block in a space that was occupied by the removed portion of the sidewall portion of the sacrificial layer;
   forming a source region and a drain region such that the diffusion block is between the sacrificial layer and at least one of the source region and the drain region;
   converting a portion of the sidewall portion of the nanowire layer to a source extension region or a drain extension region; and
   removing the sacrificial layer using a sacrificial layer removal process, wherein the diffusion block prevents the sacrificial layer removal process from also removing portions of at least one of the source region and the drain region;
   wherein converting the sidewall portion of the nanowire layer to the source extension region or the drain extension region comprises implanting dopant to the source region or the drain region to form at least one junction.

2. The method of claim 1, wherein the sacrificial layer removal process comprises a wet process.

3. The method of claim 2, wherein a selectivity of the wet process to the diffusion block is below a predetermined threshold.

4. The method of claim 2, wherein the wet process comprises an etch.

5. The method of claim 1, wherein the sacrificial layer removal process comprises a reactive ion etch.

6. The method of claim 5, wherein the reactive ion etch causes an etch rate of the diffusion block that is below a predetermined threshold.

7. The method of claim 1, wherein the forming of the sacrificial layer and the nanowire layer comprises forming a stack comprising alternating sacrificial layers and nanowire layers.

8. The method of claim 1 further comprising:
   forming a gate region around the nanowire layer;
   wherein the gate region controls a flow of current from the source region through the nanowire layer into the drain region.

9. The method of claim 1, wherein the at least one junction comprises an extension junction of the nanowire layer.

* * * * *